United States Patent
Yamaguchi et al.

(10) Patent No.: US 11,616,342 B2
(45) Date of Patent: Mar. 28, 2023

(54) SEMICONDUCTOR OPTICAL ELEMENT, SEMICONDUCTOR OPTICAL INTEGRATED ELEMENT, AND METHOD FOR MANUFACTURING SEMICONDUCTOR OPTICAL ELEMENT

(71) Applicant: Mitsubishi Electric Corporation, Tokyo (JP)

(72) Inventors: Tsutomu Yamaguchi, Tokyo (JP); Hitoshi Sakuma, Tokyo (JP); Kazuyuki Onoe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 352 days.

(21) Appl. No.: 16/958,819

(22) PCT Filed: Apr. 2, 2018

(86) PCT No.: PCT/JP2018/014095
§ 371 (c)(1),
(2) Date: Jun. 29, 2020

(87) PCT Pub. No.: WO2019/193622
PCT Pub. Date: Oct. 10, 2019

(65) Prior Publication Data
US 2021/0075194 A1    Mar. 11, 2021

(51) Int. Cl.
*H01S 5/22* (2006.01)
*G02B 6/02* (2006.01)
(Continued)

(52) U.S. Cl.
CPC .................. *H01S 5/22* (2013.01); *G02B 6/02* (2013.01); *G02F 1/01* (2013.01); *H01S 5/1003* (2013.01)

(58) Field of Classification Search
CPC ........ H01S 5/22; H01S 5/1003; H01S 5/2086; H01S 5/2081; H01S 5/1231; H01S 5/12; H01S 5/2219; G02B 6/02; G02F 1/01
See application file for complete search history.

(56) References Cited

U.S. PATENT DOCUMENTS 6,287,884 B1 * 9/2001 Jie ........................... H01S 5/227
438/46
2001/0026672 A1 * 10/2001 Kinoshita .............. G02B 6/131
385/132
(Continued)

FOREIGN PATENT DOCUMENTS

JP    H09-199791 A    7/1997
JP    2001-274510 A   10/2001
(Continued)

OTHER PUBLICATIONS

International Search Report issued in PCT/JP2018/014095; dated May 29, 2018.

*Primary Examiner* — Xinning(Tom) Niu
(74) *Attorney, Agent, or Firm* — Studebaker & Brackett PC

(57) ABSTRACT

A semiconductor optical element includes a first cladding layer; a second cladding layer formed in a ridge shape; and optical confinement layer interposed between the first cladding layer and the second cladding layer to propagate light, wherein the second cladding layer is configured with a ridge bottom layer; a ridge intermediate layer; and a ridge top layer in this order from the optical confinement layer, and the ridge intermediate layer is formed wider in cross section perpendicular to the optical axis—the light propagating direction in optical confinement layer—than the ridge bottom layer and the ridge top layer.

14 Claims, 16 Drawing Sheets

(51) Int. Cl.
*G02F 1/01* (2006.01)
*H01S 5/10* (2021.01)

(56) References Cited

U.S. PATENT DOCUMENTS

| | | | |
|---|---|---|---|
| 2002/0187577 A1* | 12/2002 | Sakata | H01S 5/2231 |
| | | | 438/46 |
| 2005/0030997 A1* | 2/2005 | Tanaka | H01S 5/2231 |
| | | | 372/46.01 |
| 2008/0247439 A1* | 10/2008 | Uchida | H01S 5/04254 |
| | | | 372/87 |
| 2012/0033698 A1* | 2/2012 | Morizumi | H01S 5/0281 |
| | | | 438/47 |
| 2014/0328363 A1* | 11/2014 | Kwon | H01S 5/22 |
| | | | 372/45.01 |

FOREIGN PATENT DOCUMENTS

| | | |
|---|---|---|
| JP | 2006-324427 A | 11/2006 |
| JP | 2010-062273 A | 3/2010 |
| JP | 2012-009488 A | 1/2012 |
| JP | 2016-184705 A | 10/2016 |

\* cited by examiner

SEMICONDUCTOR OPTICAL ELEMENT, SEMICONDUCTOR OPTICAL INTEGRATED ELEMENT, AND METHOD FOR MANUFACTURING SEMICONDUCTOR OPTICAL ELEMENT

TECHNICAL FIELD

The present application relates to ridge-type semiconductor optical elements.

BACKGROUND ARTS

Optical communication systems use semiconductor optical elements as a laser light source or an optical amplifier. The semiconductor optical elements are frequently used as a distributed feedback laser diode (DFB-LD; also referred to as a DFB laser diode). Moreover, a ridge-type semiconductor optical element is used for the DFB laser diode (for example, Patent Document 1). The DFB laser diode needs to have a diffraction grating buried therein. A semiconductor crystal regrowth region, such as a buried portion indispensable to formation of the diffraction grating for the ridge-type DFB laser diode, contains crystal defects such as dislocations. In the ridge-type DFB laser diode, concentration of stress on the buried portion or on the active layer from films such as the insulating film and the metal film causes slow variations in characteristics (Ith variation, Iop variation).

Not limited to the ridge-type DFB laser diode, a semiconductor optical element having a ridge-type waveguide structure has posed such the same problem caused by stress imposing on an optical confinement layer for confining and propagating light. Conventionally, to satisfy reliability for the problem, concentration of stress on relevant regions is relieved such as by quality adjustment of films (deposition method, deposition conditions, and the like) or by configuration of films such as the insulating film and the metal film.

On the other hand, there has been proposed a manufacturing process for a ridge-type semiconductor optical element that can reduce variations in width of the ridge lower layer by making a ridge structure such that the width of the ridge upper layer is formed wider than that of the ridge lower layer (see Patent Document 2).

PRIOR ART DOCUMENTS

Patent Documents

Patent Document 1: JP2006-324427A
Patent Document 2: JP2012-009488A

SUMMARY OF THE INVENTION

Problem that the Invention is to Solve

As described above, the ridge-type semiconductor optical element has posed the problem with stress imposing on the optical confinement layer such as the semiconductor crystal regrowth region in the buried portion or the active layer; hence, it has been needed to provide a device structure that can be stably manufactured and is able to relieve the stress not by the conventional stress adjustment such as of the insulating film and metal layer.

The present application discloses a technology for resolving the above-described problem and is aimed at providing a semiconductor optical element that can be stably manufactured and is able to relieve the stress by refining the device structure itself.

Means for Solving the Problem

A semiconductor optical element disclosed in the present application includes a first cladding layer; a second cladding layer having a ridge formed in a ridge shape; an optical confinement layer interposed between the first cladding layer and the second cladding layer and adapted to propagate light, wherein the ridge is configured with a ridge bottom layer, a ridge intermediate layer and a ridge top layer in this order from the optical confinement layer, ridge intermediate layer is formed wider in cross section perpendicular to the optical axis—the light propagating direction in the optical confinement layer—than the ridge bottom layer and the ridge top layer, and a thickness of the ridge bottom layer is in a range of 10% to 15% of a thickness of the ridge.

Advantage Effect of the Invention

According to the disclosure of the present application, a semiconductor optical element can be provided that is stably manufacturable and is able to relieve the stress.

EMBODIMENTS FOR CARRYING OUT THE INVENTION

Embodiment 1

Figure 1:
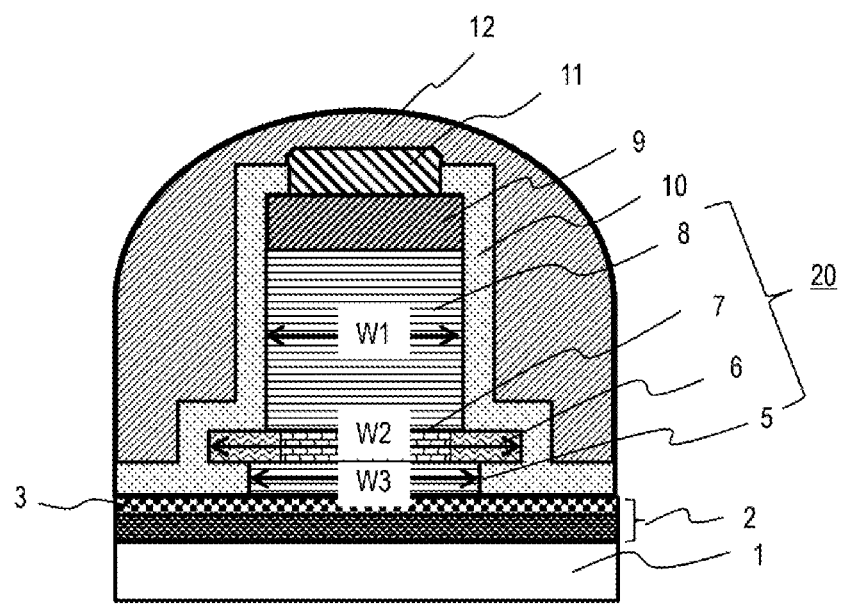
FIG. 1 is a cross sectional view showing a configuration of a semiconductor optical element according to Embodiment 1.

FIG. 1 is a cross-sectional view taken perpendicular to the direction of the optical axis, i.e., the light propagation direction, showing a configuration of a semiconductor optical element according to Embodiment 1. The semiconductor optical element is called a ridge-type DFB laser diode. An active layer 2 having a top surface layer 3 is formed on a semiconductor substrate 1. The active layer 2 emits light by recombining electrons and holes. The emitted light is confined in the active layer 2 including the top surface layer 3 and propagates in the active layer 2 in the optical-axis direction, i.e., in the direction perpendicular to the sheet. In order to confine light in the active layer 2, the active layer 2 is necessary to be sandwiched between cladding layers having refractive indexes smaller than that of the active layer 2. The cladding layers also have functions of injecting electrons into the active layer 2 from one of the cladding layers and of injecting holes into the active layer 2 from the other cladding layer. In the configuration shown in FIG. 1, the semiconductor substrate 1 functions as one cladding layer, i.e., a first cladding layer. On the top surface layer 3 of the active layer 2, a ridge 20 is formed that functions as the other cladding layer, i.e., a second cladding layer. The ridge 20 is configured with a ridge bottom layer 5, a ridge intermediate layer 6 that is a diffraction grating layer having a regrown region 7 in which a diffraction grating specific to DFB is buried, and a ridge top layer 8 in this order from the active layer 2. On the ridge top layer 8, an electrode 11 is further formed with interposition of a contact layer 9. The ridge 20 with inclusion of the contact layer 9 and the electrode 11 formed thereon are covered with an insulating film 10, and the outside thereof is further covered with a metal such as gold plating 12.

The semiconductor optical element having the above-described configuration, which is the DFB laser diode, basically includes the first cladding layer (the semiconductor substrate 1), the second cladding layer (the ridge 20) formed in a ridge shape, and the active layer 2, which is an optical confinement layer, interposed between the first cladding layer and the second cladding layer to propagate light.

In the configuration shown in FIG. 1, the ridge intermediate layer 6, the diffraction grating layer is formed to have a width W2 wider than the width W1 of the ridge top layer 8 and the width W3 of the ridge bottom layer 5. In other words, the ridge intermediate layer 6 interposed between the ridge bottom layer 5 and the ridge top layer 8 is formed to extend wider than the ridge bottom layer and the ridge top layer. Forming part of the ridge 20 to have extending portions allows the width W3 of the ridge bottom layer 5 and the width W1 of the ridge top layer 8 to be freely designed and stress imposing on the active layer 2 to be relieved, thereby being able to further satisfy various desired characteristics such as of optical confinement and device resistance. Note that the ridge bottom layer 5 and the ridge top layer 8 are preferably formed of the same material.

A dimension of each layer of the ridge is specifically exemplified here. The exemplar dimensions are for a laser light of 1.5 μm wavelength band. The width W1 of the ridge top layer 8 and the width W3 of the ridge bottom layer 5 are 2 μm in extent, and the width W2 of the ridge intermediate layer 6 is wider than the widths W1 and W3 by about 10%. From the standpoints of optics and stress relief, the width W2 of the ridge intermediate layer 6 is preferably 10% to 20% wider than the width W1 of the ridge top layer 8 (1.1*W1≤W2≤1.2*W1) irrespective of the wavelength of light. The thickness of the ridge 20, i.e., the sum of thicknesses of the ridge bottom layer 5, the ridge intermediate layer 6, and the ridge top layer 8 is 2 μm in extent, and the thickness of the ridge bottom layer 5 is preferably 10% or more to 15% or less of that of the ridge 20 from the standpoints of optics and stress relief, irrespective of the wavelength of light. Moreover, the thickness of the ridge intermediate layer 6 is preferably 1% or more to 5% or less of that of the ridge considering function of the diffraction grating and stress relief, irrespective of the wavelength of light.

Figure 2:
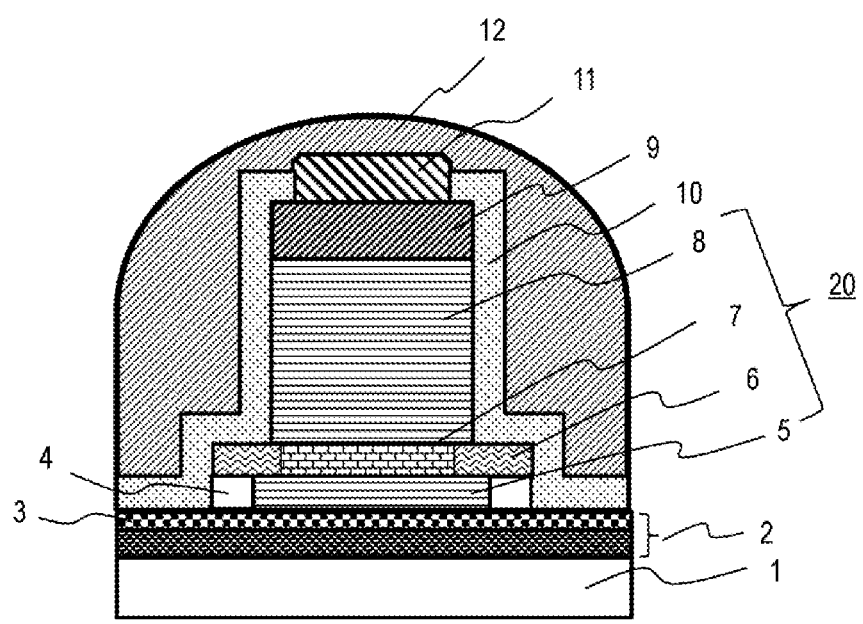
FIG. 2 is a cross sectional view showing another configuration of the semiconductor optical element according to Embodiment 1.

FIG. 2 is a cross-sectional view showing another configuration of the semiconductor optical element according to Embodiment 1. The configuration shown in FIG. 2 has hollow spaces 4 formed, without filled such as with the insulating film 10 and the gold plating 12, between the extending portions of the ridge intermediate layer 6 wider than the ridge bottom layer 5 and the active layer 2. The hollow spaces 4 can be formed by, for example, sputtering. With the configuration having the hollow spaces 4, concentration of stress on the ridge bottom layer 5 is also relieved, thereby being able to prevent the active layer 2 from deteriorating.

Figure 3:
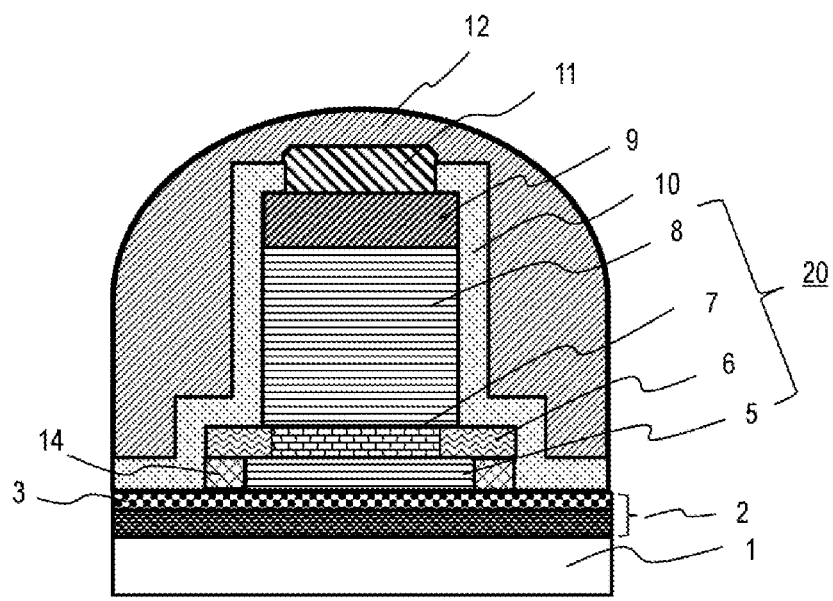
FIG. 3 is a cross sectional view showing still another configuration of the semiconductor optical element according to Embodiment 1.

FIG. 3 is a cross-sectional view showing still another configuration of the semiconductor optical element according to Embodiment 1. The configuration shown in FIG. 3 has organic films 14 filled between the active layer 2 and the extending portions of the ridge intermediate layer 6 wider than the ridge bottom layer 5. With the configuration having the organic films 14, concentration of stress on the ridge bottom layer 5 is also relieved, thereby being able to prevent the active layer 2 from deteriorating.

As described above, the semiconductor optical element according to Embodiment 1 includes the first cladding layer (semiconductor substrate 1); the second cladding layer (the ridge 20) formed in the ridge shape; and the active layer 2, the optical confinement layer interposed between the first cladding layer and the second cladding layer to propagate light, wherein the ridge 20 is configured with the ridge bottom layer 5; the ridge intermediate layer 6; and the ridge top layer 8 in this order from the active layer 2, and the ridge intermediate layer 6 is formed wider in cross section perpendicular to the optical axis—the light propagating direction in the active layer 2—than the ridge bottom layer 5 and the ridge top layer 8. In Embodiment 1, the ridge intermediate layer 6 is formed as the diffraction grating layer. With this configuration, the semiconductor optical element can be fabricated that relieves stress imposing on the active layer 2 and is further able to satisfy various desired characteristics such as of optical confinement and device resistance.

Figure 4:
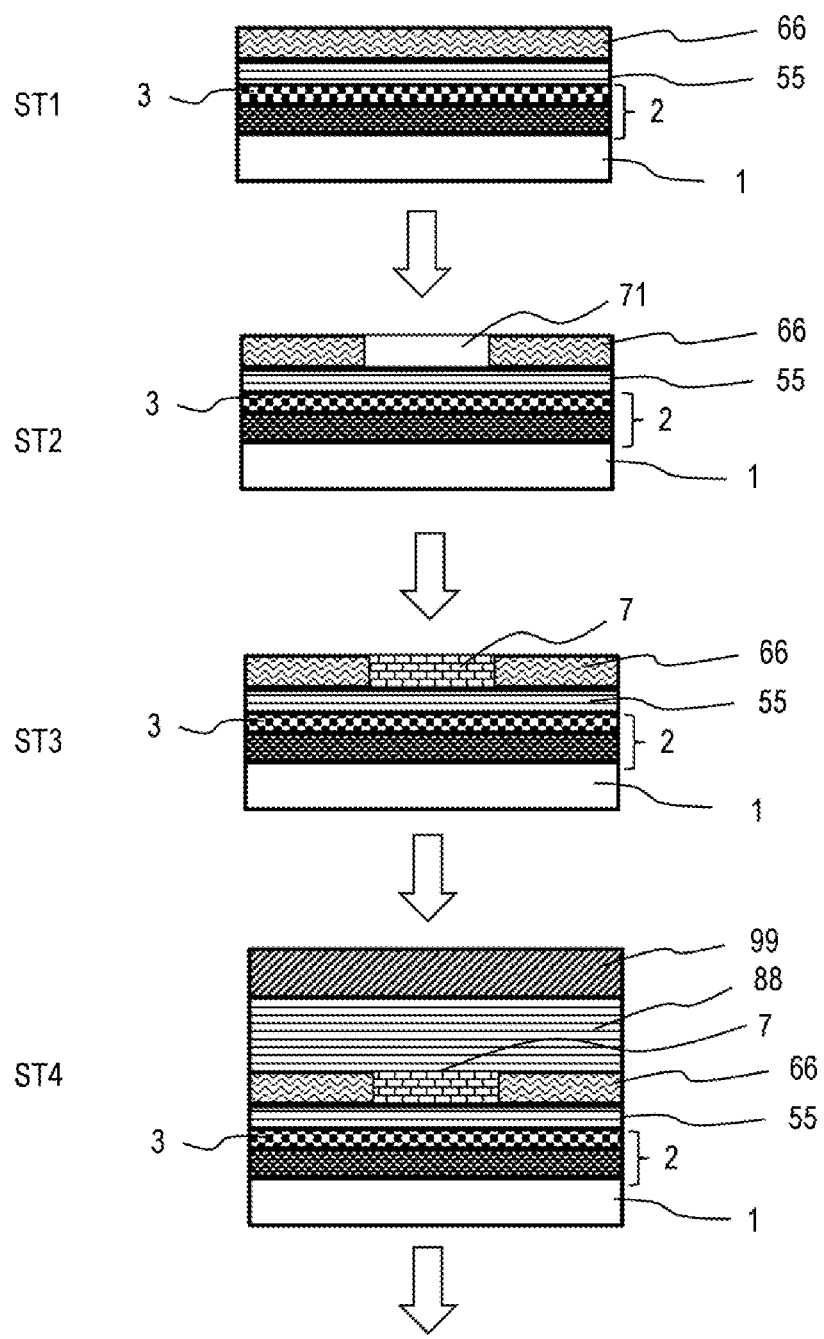
FIG. 4 shows the first cross-sectional diagrams illustrating steps of a method of manufacturing the semiconductor optical element according to Embodiment 1.
Figure 5:
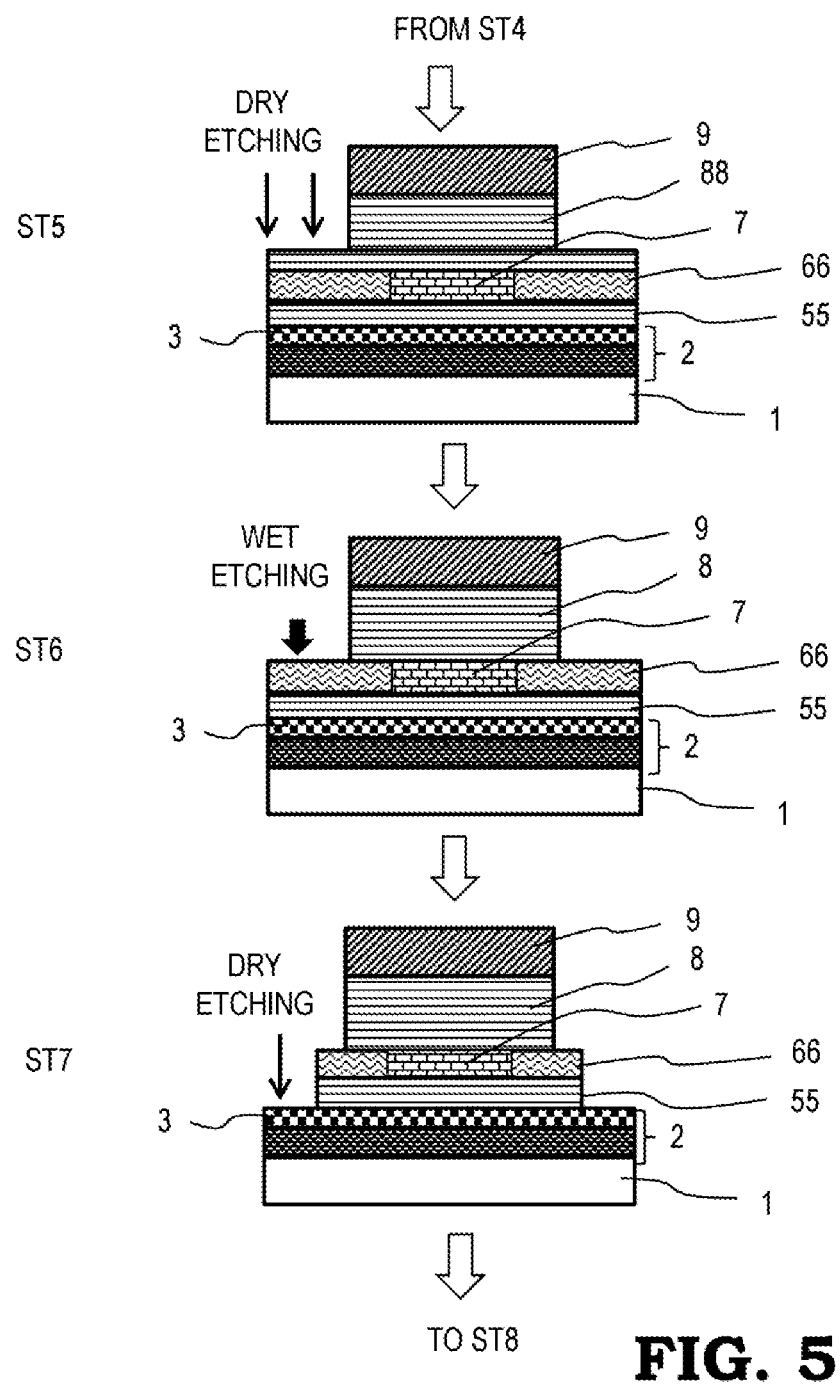
FIG. 5 shows the second cross-sectional diagrams illustrating the next steps of the method of manufacturing the semiconductor optical element according to Embodiment 1.
Figure 6:
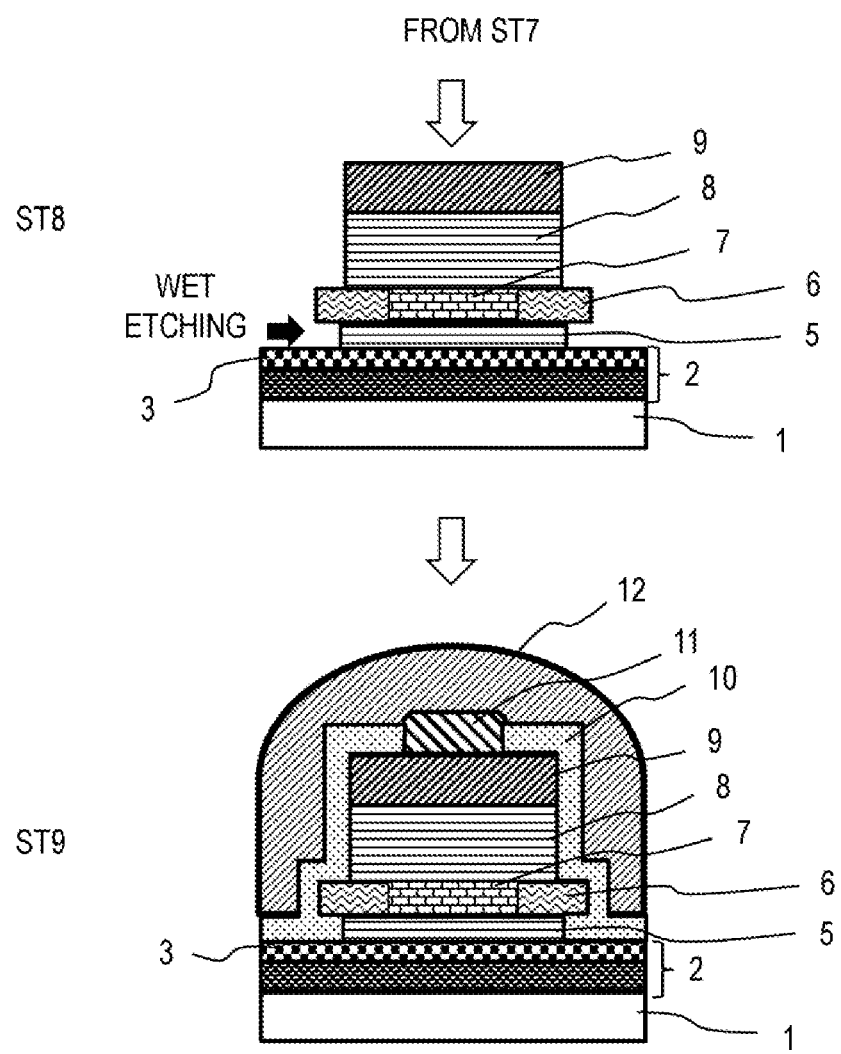
FIG. 6 shows the third cross-sectional diagrams illustrating the further next steps of the method of manufacturing the semiconductor optical element according to Embodiment 1.

Next, a method of manufacturing the semiconductor optical element having the configuration shown in FIG. 1 is described with reference to FIGS. 4 to 6 showing cross-sectional views for illustrating the manufacturing steps in order. As shown in Step ST1 of FIG. 4, the active layer 2, which is a first semiconductor layer 2, is grown on the semiconductor substrate 1, and a second semiconductor layer 55 is formed thereon as an InP layer by growing InP, the material for the ridge bottom layer, and a third semiconductor layer 66 is further formed thereon as an InGaAsP layer by growing InGaAsP, the material for the ridge intermediate layer. A buffer layer of the same conductive type as that of the semiconductor substrate 1 may be formed between the semiconductor substrate 1 and the active layer 2. The active layer 2 has the top surface layer 3 formed therein. A thin cap layer may be formed by growing Inp on the third InGaAsP semiconductor layer 66. Next, a portion 71 for burying a diffraction grating is formed by etching part of the third InGaAsP semiconductor layer 66, as shown in Step ST2. After that, in order to form a buried diffraction grating in the portion 71 for burying a diffraction grating, InP is grown and buried to form a diffraction grating buried region 7, as shown in Step ST3. Then, a fourth semiconductor layer 88 is formed as an InP layer by growing InP, the material for the ridge top layer, and an InGaAs layer 99 is further formed thereon by growing InGaAs, the material for the contact layer 9, as shown in Step ST4. A thin cap layer may be formed by growing InP on the InGaAs layer 99.

Next, in order to form the ridge structure, the contact layer and the fourth layer are dry-etched such as using an insulating-film hard mask of $SiO_2$ or the like to have a width necessary for exhibiting desired characteristics, as shown in Step ST5 of FIG. 5. In this step, part of the fourth InP semiconductor layer 88 is left on the third InGaAsP semiconductor layer 66. Next, the InP left on the third InGaAsP semiconductor layer 66 is wet-etched, as shown in Step ST6. At this time, using a wet etchant having a sufficient ratio in etching selectivity between to InGaAsP for the third semiconductor layer 66 and to InP for the fourth semiconductor layer 88 increases accuracy in processing the ridge. Thus, by these steps of etching the fourth semiconductor layer 88 and the InGaAsP layer 99, the ridge top layer 8 and the contact layer 9 have been formed.

Next, both side portions of the third InGaAsP semiconductor layer 66 and those of the second InP semiconductor layer 55 are removed by dry etching, as shown in Step ST7. Furthermore, by utilizing side-etching effect, the third semiconductor layer 66 is wet etched to have a desired width W2 of the ridge intermediate layer 6 and the second semiconductor layer 55 is wet etched to have a desired width W3 of the ridge bottom layer 5, as shown in Step ST8 of FIG. 6. At this time, the active layer 2 is not etched because the top surface layer 3 is formed, as a layer difficult to etch, on the surface of the active layer 2. In this step, using a wet etchant having a sufficient ratio etching selectivity between to InGaAsP for the third semiconductor layer 66 and to InP for the fourth semiconductor layer 55 increases accuracy in processing the ridge. Thus, by these steps of etching the third semiconductor layer 66 and the second semiconductor layer 55, the ridge intermediate layer 6 and the ridge bottom layer 5 have been formed. In addition, it is also possible that the dry etching is performed not only for both side portions of the third semiconductor layer 66 completely but also halfway to the second semiconductor layer 55 for it to be exposed from the third semiconductor layer 66 in Step ST7 and then the second InP semiconductor layer 55 is wet-etched to have the desired width W3 of the ridge bottom layer in Step ST8.

Finally, after the insulating film 10 is formed by a deposition method, such as a plasma CVD providing an excellent coverage, a top portion of the insulating film on the contact layer 9 is removed and the electrode 11 necessary for device operation is formed, and then the ridge is wholly covered with a metal such as gold plating 12, as shown in Step ST9. In forming the insulating film 10, using a sputtering, which provides less sufficient coverage for indentation and the like, allows for forming the structure shown in FIG. 2 having, between the ridge intermediate layer 6 and the active layer 2, the hollow spaces 4 in the recesses with no InP of the ridge bottom layer 5, thereby relieving stress imposing on the active layer 2. In addition, employing the structure shown in FIG. 3 having the organic films 14, which are formed and left only in the recesses before covered with the insulating film 10, also allows for relieving stress imposing on the active layer 2.

Embodiment 2

Figure 7:
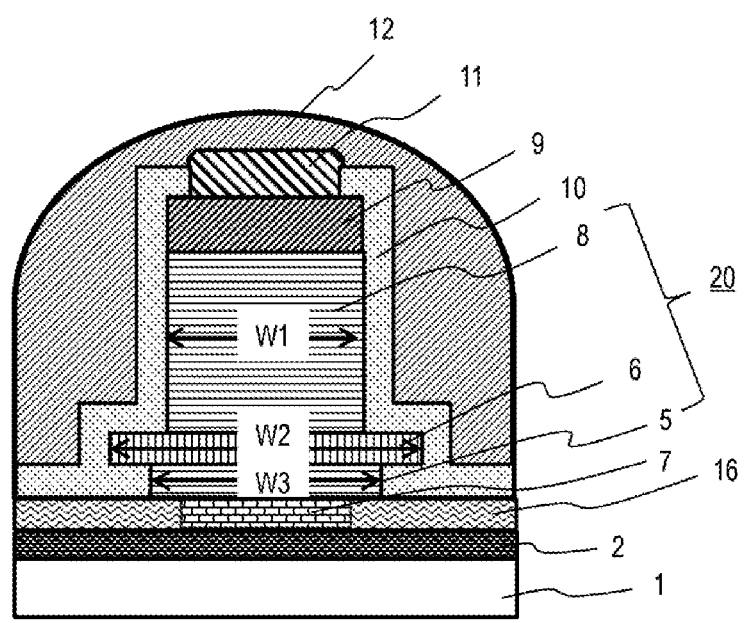
FIG. 7 is a cross sectional view showing a configuration of a semiconductor optical element according to Embodiment 2.

FIG. 7 is a cross sectional view taken perpendicular to the optical axis, showing a configuration of a semiconductor optical element according to Embodiment 2. As with FIG. 1, the semiconductor optical element is called a ridge-type DFB laser diode. An active layer 2 is formed on a semiconductor substrate 1. Light is confined and propagates in the active layer 2. To confine light in the active layer 2, the active layer 2 is necessary to be sandwiched between cladding layers having refractive indexes smaller than that of the active layer 2. In the configuration shown in FIG. 7, the semiconductor substrate 1 acts as one cladding layer, i.e., a first cladding layer. On the active layer 2, a diffraction grating layer 16 having a regrown region 7 is formed in which a diffraction grating specific to DFB is buried. On the diffraction grating layer 16, a ridge 20 is formed, and the diffraction grating layer 16 and the ridge 20 act as the other cladding layer, i.e., a second cladding layer. The ridge 20 is configured with a ridge bottom layer 5, a ridge intermediate layer 6, and a ridge top layer 8 in this order from the active layer 2. Furthermore, an electrode 11 is formed on the ridge top layer 8 with interposition of a contact layer 9. The ridge 20 with the inclusion of the contact layer 9 and the electrode 11 formed thereon are covered with an insulating film 10, and the outside thereof is further covered with a metal such as gold plating 12.

In the configuration shown in FIG. 7, the ridge intermediate layer 6 is formed to have the width W2 wider than the width W1 of the ridge top layer 8 and the width W3 of the ridge bottom layer 5. While in the configuration shown in FIG. 1 described in Embodiment 1, the diffraction grating layer is formed as the ridge intermediate layer 6 between the ridge bottom layer 5 and the ridge top layer 8. In Embodiment 2, a diffraction grating layer 16 is formed in contact with the active layer 2 and the ridge intermediate layer 6 is formed that has no region of buried diffraction grating between the ridge bottom layer 5 and the ridge top layer 8 in the ridge 20. The ridge intermediate layer 6 is formed to extend wider than the other layers in the ridge 20. In other words, the ridge intermediate layer 6 is formed to have the width W2 wider than the width W3 of the ridge bottom layer 5 and the width W1 of the ridge top layer 8. With this configuration, the width W3 of the ridge bottom layer 5 and the width W1 of the ridge top layer 8 can be freely designed and stress imposing on the active layer 2 can be relieved, thereby being further able to satisfy various desired characteristics such as of light confinement and device resistance.

Note that the ridge bottom layer 5 and the ridge top layer 8 are preferably formed of the same material.

In the configuration of Embodiment 1, since the ridge intermediate layer 6 also serves as the diffraction grating layer, the ridge intermediate layer 6 is formed of the material different from those of the ridge bottom layer 5 and the ridge top layer 8. In Embodiment 2, i.e., in the configuration shown in FIG. 7, the ridge intermediate layer 6 can also be formed of the same material as those of the ridge bottom layer 5 and the ridge top layer 8. However, when the ridge top layer 8, the ridge intermediate layer 6, and the ridge bottom layer 5 are formed by etching, employing a material for the ridge intermediate layer 6 different from those of the ridge top layer 8 and the ridge bottom layer 5 makes it easy to manufacture the ridge.

Also, in the semiconductor optical element according to Embodiment 2, the width W2 of the ridge intermediate layer 6 is preferably 10% to 20% wider than the width W1 of the ridge top layer 8 (1.1*W1≤W2≤1.2*WP from the standpoints of optics and relief of the stress. Furthermore, the thickness of the ridge bottom layer 5 is preferably 10% or more to 15% or less of that of the ridge 20 and the thickness of the ridge intermediate layer 6 is preferably 1% or more to 5% or less of that of the ridge from standpoints of optics and relief of the stress.

Figure 8:
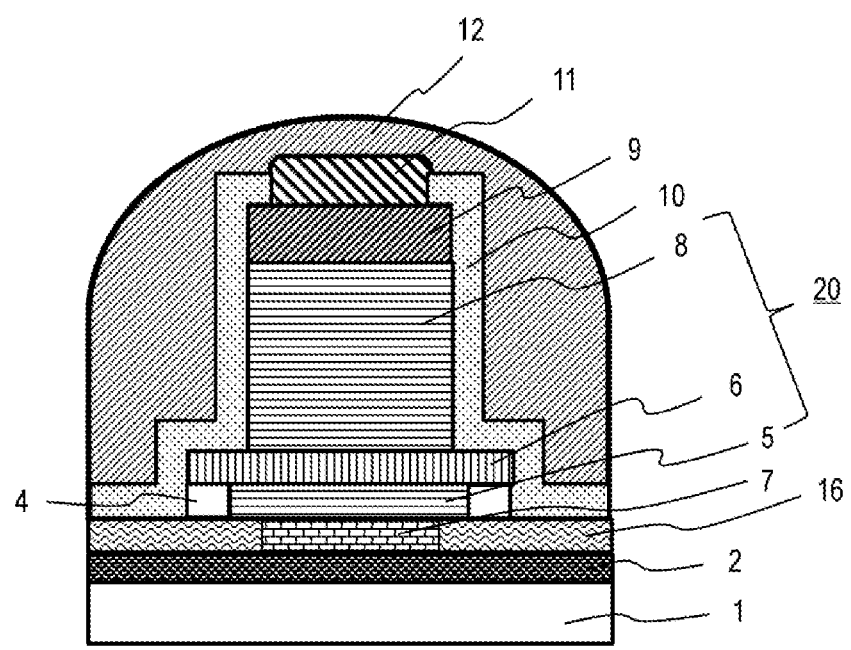
FIG. 8 is a cross sectional view showing another configuration of the semiconductor optical element according to Embodiment 2.

FIG. 8 is a cross-sectional view showing another configuration of the semiconductor optical element according to Embodiment 2. The configuration shown in FIG. 8, has hollow spaces 4 formed, without filled such as with the insulating film 10 and the gold plating 12, between the active layer 2 and the extending portion of the ridge intermediate layer 6. The hollow spaces 4 can be formed by, for example, sputtering. With the configuration having the hollow spaces 4, concentration of stress on the ridge bottom layer 5 is also relieved, thereby being able to prevent the active layer 2 from deteriorating.

Figure 9:
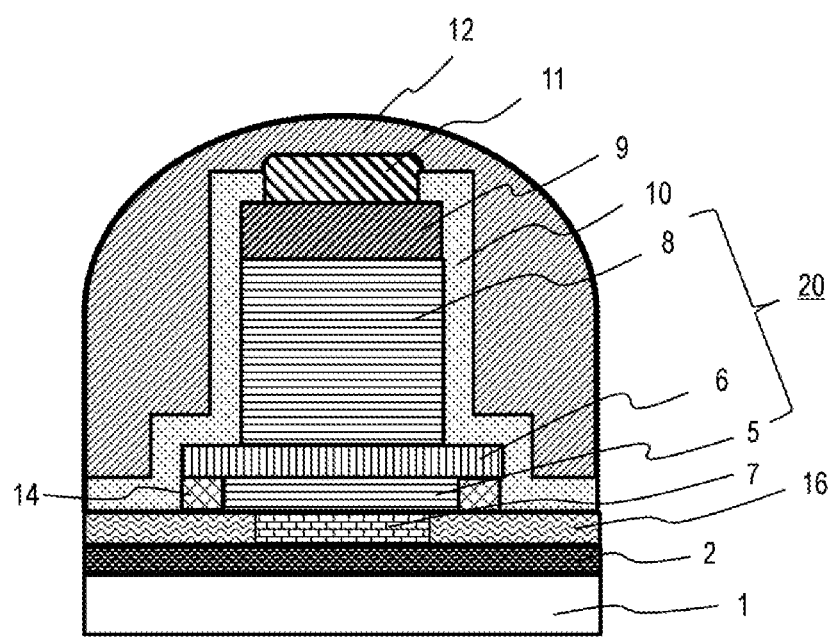
FIG. 9 is a cross-sectional view showing still another configuration the semiconductor optical element according to Embodiment 2.

FIG. 9 is a cross-sectional view showing still another configuration of the semiconductor optical element according to Embodiment 2. The configuration shown in FIG. 9 has the organic films 14 filled between the active layer 2 and the extending portions of the ridge intermediate layer 6. With the configuration having the organic films 14, concentration of stress on the ridge bottom layer 5 is also relieved, thereby being able to prevent the active layer 2 from deteriorating.

As described above, the semiconductor optical element according to Embodiment 2 includes the first cladding layer (semiconductor substrate 1); the second cladding layer (the ridge 20) formed in a ridge shape; and the active layer 2, the optical confinement layer interposed between the first cladding layer and the second cladding layer to propagate light, wherein the ridge 20 is configured with the ridge bottom layer 5; the ridge intermediate layer 6; and the ridge top layer 8 in this order from the active layer 2, and the ridge intermediate layer 6 is formed wider in cross section perpendicular to the optical axis—the light propagating direction in the active layer 2—than the ridge bottom layer 5 and the ridge top layer 8. In Embodiment 2, the diffraction grating 16 is formed arranged nearer the active layer 2 than the ridge bottom layer 5, and the wide ridge intermediate layer 6 is formed separately from the diffraction grating layer 16. Also with this configuration, a semiconductor optical element can be fabricated that relieves stress imposing on the active layer 2 and is further able to satisfy various desired characteristics such as of optical confinement and device resistance, as with Embodiment 1.

Figure 10:
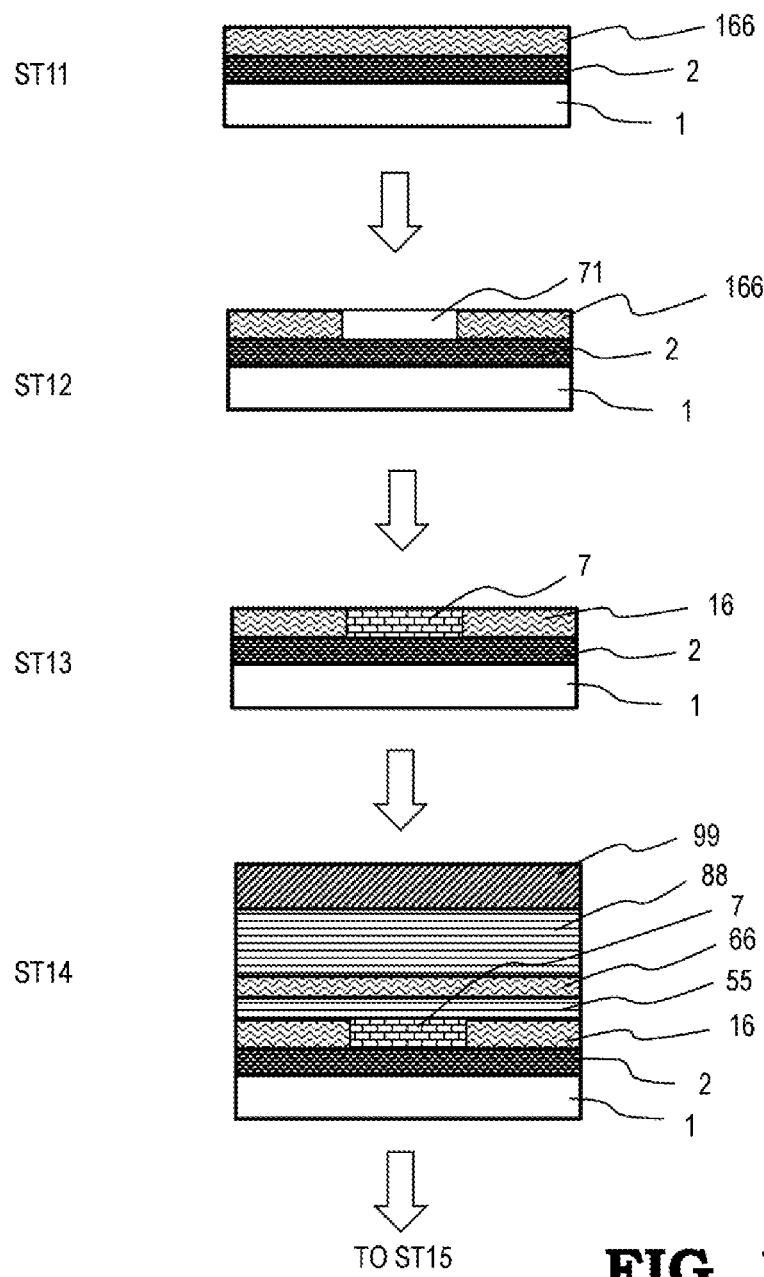
FIG. 10 shows the first cross-sectional diagrams illustrating steps of a method of manufacturing the semiconductor optical element according to Embodiment 2.
Figure 11:
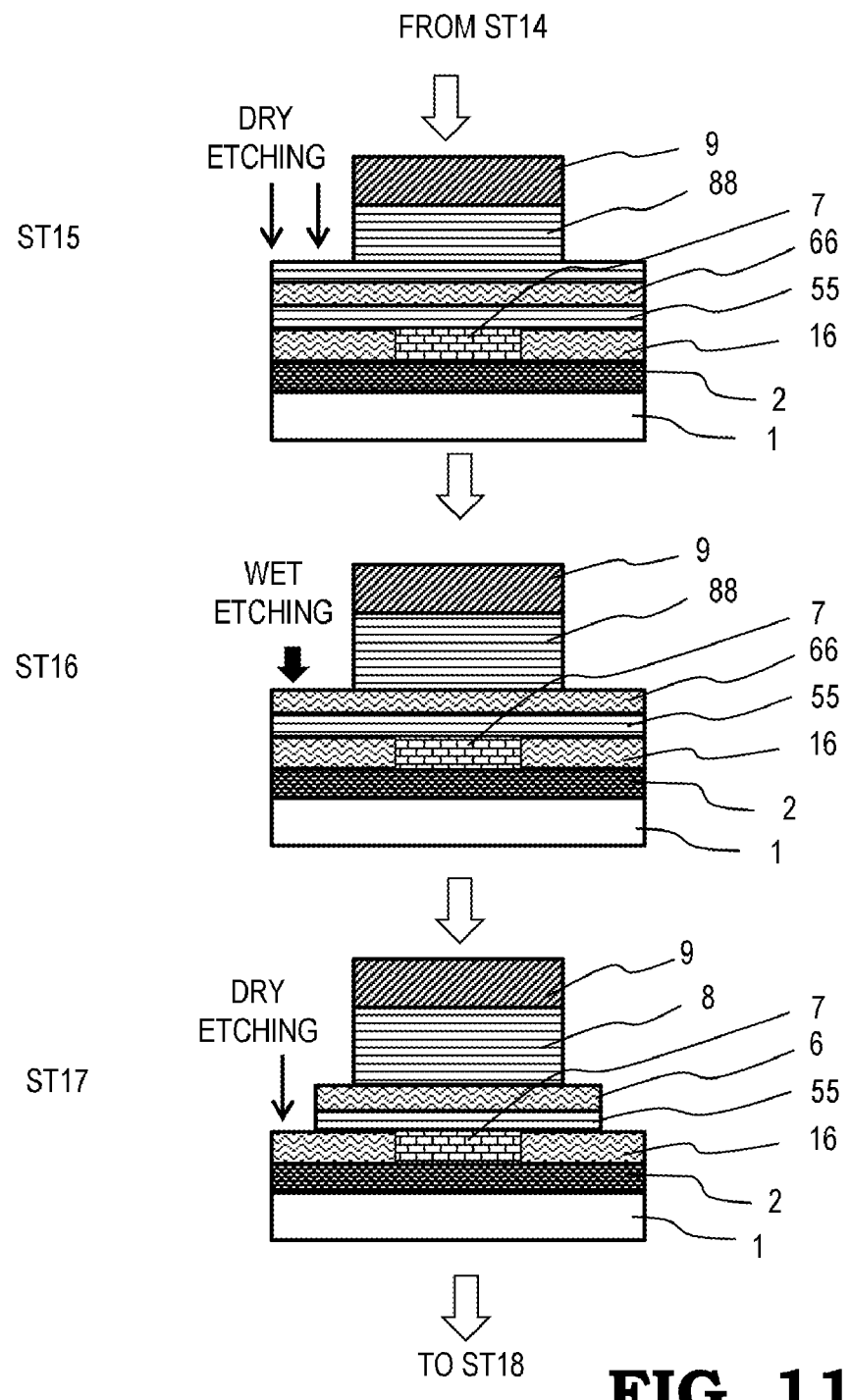
FIG. 11 shows the second cross-sectional diagrams illustrating the next steps of the method of manufacturing the semiconductor optical element according to Embodiment 2.
Figure 12:
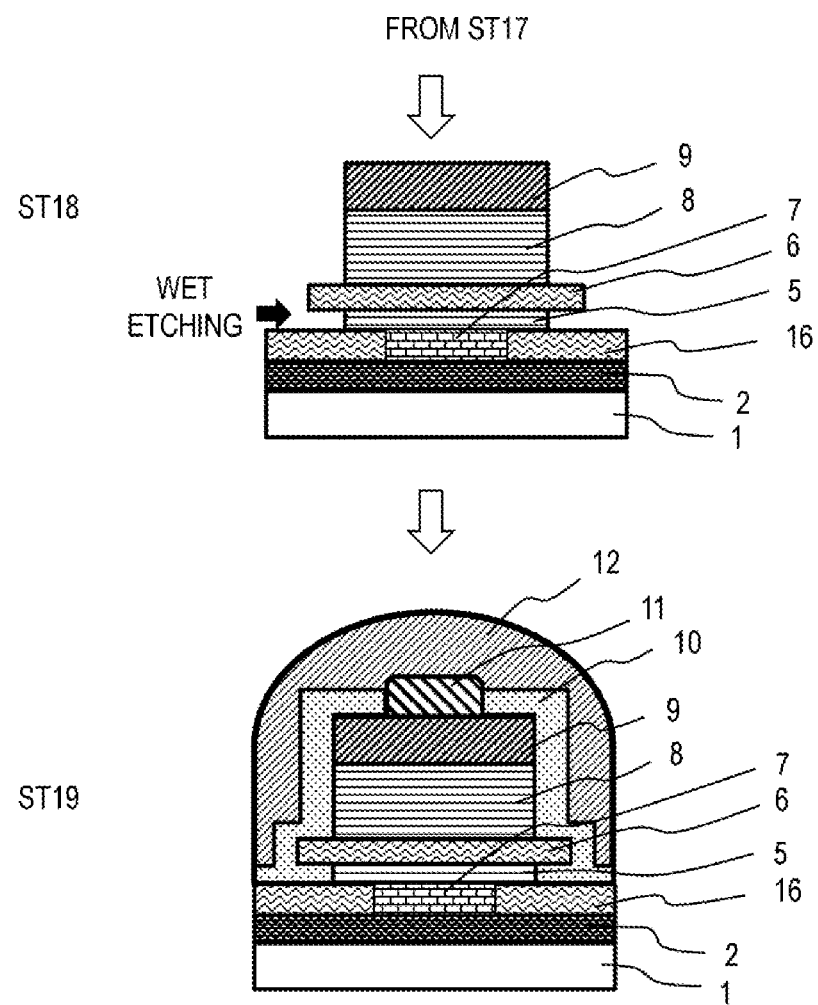
FIG. 12 shows the third cross-sectional diagrams illustrating the further next steps of the method of manufacturing the semiconductor optical element according to Embodiment 2.

Next, a method of manufacturing the semiconductor optical element having the configuration shown in FIG. 7 is described with reference to FIGS. 10 to 12 showing cross-sectional views for illustrating the manufacturing steps in order. As shown in Step ST11 of FIG. 10, the active layer 2, the first semiconductor layer 2 is grown on the semiconductor substrate 1, and a fifth semiconductor layer 166 is formed thereon as an InGaAsP layer by growing InGaAsP, the material for the diffraction grating layer 16. A buffer layer of the same conductive type as that of the semiconductor substrate 1 may be formed between the semiconductor substrate 1 and the active layer 2. A thin cap layer may be formed by growing Inp on the fifth InGaAsP semiconductor layer 166. Next, a portion 71 for burying a diffraction grating is formed by etching part of the fifth InGaAsP semiconductor layer 166, as shown in Step ST12. After that, in order to form a buried diffraction grating in the portion 71 for burying a diffraction grating, InP is grown and buried to form a diffraction grating buried region 7, i.e., diffraction grating 16 is formed as shown in Step ST13. Then, the second semiconductor layer 55 is formed as an InP layer by growing InP, the material for the ridge bottom layer 5 and the third semiconductor layer 66 is formed thereon as an InGaAsP layer by growing InGaAsP, the material for the ridge intermediate layer 6, and then the fourth semiconductor layer 88 is formed thereon as an InP layer by growing Inp, the material for the ridge top layer 8 and an InGaAs layer 99 is further formed thereon by growing InGaAs, the material for the contact layer 9, as shown in Step ST14. A thin cap layer may be formed by growing InP on the InGaAs layer 99.

Next, in order to form the ridge structure, the contact layer and the fourth layer are dry-etched such as using an insulating-film hard mask of $SiO_2$ or the like to have a width necessary for exhibiting desired characteristics, as shown in Step ST15 of FIG. 11. In this step, part of the fourth InP semiconductor layer 88 is left on the third InGaAsP semiconductor layer 66. Next, the InP left on the third InGaAsP semiconductor layer 66 is wet-etched, as shown in Step ST16. At this time, using a wet etchant having a sufficient ratio in etching selectivity between to InGaAsP for the third semiconductor layer 66 and to InP for the fourth semiconductor layer 88 increases accuracy in processing the ridge. Thus, by these steps of etching the fourth semiconductor layer 88 and the InGaAsP layer 99, the ridge top layer 8 and the contact layer 9 have been formed.

Next, both side portions of the third InGaAsP semiconductor layer 66 and those of the second InP semiconductor layer 55 are removed by dry etching, as shown in Step ST17. Furthermore, by utilizing side-etching effect, the third semiconductor layer 66 is wet-etched to have a desired width W2 of the ridge intermediate layer 6 and the second semiconductor layer 55 is wet-etched to have a desired width W3 of the ridge bottom layer 5, as shown in Step ST18 of FIG. 12. At this time, using a wet etchant having a sufficient ratio in etching selectivity between to InGaAsP for the third semiconductor layer 66 and to InP for the fourth semiconductor layer 55 increases accuracy in processing the ridge. Thus, by these steps of etching the third semiconductor layer 66 and the second semiconductor layer 55, the ridge intermediate layer 6 and the ridge bottom layer 5 have been formed. In addition, it is also possible that the dry etching is performed not only for both side portions of the third semiconductor layer 66 completely but also halfway to the second semiconductor layer 55 for it to be exposed from the third semiconductor layer 66 in Step ST17, and then the second InP semiconductor layer 55 is wet-etched to have the desired width W3 of the ridge bottom layer in Step ST18.

Finally, after the insulating film 10 is formed by a deposition method, such as a plasma CVD provides an excellent coverage, a top portion of the insulating film on the contact layer 9 is removed and the electrode 11 necessary for device operation is formed, and then the ridge is wholly covered with a metal such as gold plating 12, as shown in Step ST19. In forming the insulating film 10, using a sputtering, which provides less sufficient coverage for indentation and the like, allows for forming the structure shown in FIG. 8 having, between the ridge intermediate layer 6 and the active layer 2 on which the diffraction grating layer 16 is formed, the hollow spaces 4 in the recesses with no InP of the ridge bottom layer 5, thereby relieving stress imposing on the active layer 2. In addition, employing the structure shown in FIG. 9 having the organic films 14, which are formed and left only in the recesses before covered with the insulating film 10, also allows for relieving stress imposing on the active layer 2.

Embodiment 3

Figure 13:
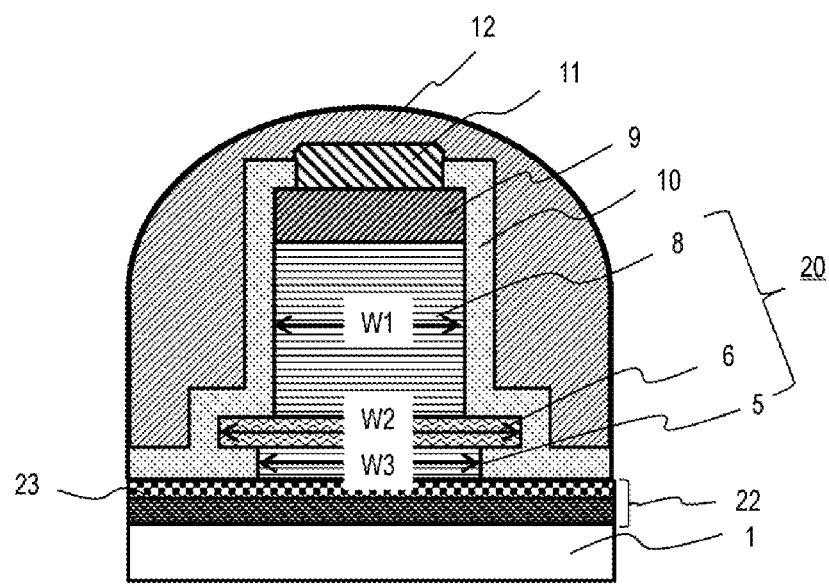
FIG. 13 is a cross sectional view showing a configuration of a semiconductor optical element according to Embodiment 3.

FIG. 13 is a cross-sectional view taken perpendicular to the optical axis, showing a configuration of a semiconductor optical element according to Embodiment 3. The semiconductor optical element shown as an example in FIG. 13 is an element called a ridge-type electro-absorption modulator (EAM). While the ridge-type DFB laser diodes of Embodiments 1 and 2 include the active layer as the optical confinement layer, the semiconductor optical element of Embodiment 3 includes an active layer 22 as the optical confinement layer, instead. The EAM having no diffraction grating buried layer has the active layer 22 formed as a layer that absorbs light when an electric field is applied thereto, thereby being able to modulate passing light by on/off of the electric field. Note that a top surface layer 23 is formed on the surface on the ridge side of the active layer 22.

In such the electro-absorption semiconductor optical modulator, stress imposing on the active layer 22, i.e., the optical confinement layer is also relieved by forming, between the ridge bottom layer 5 and ridge top layer 8 of the ridge 20, the ridge intermediate layer 6 wider than the ridge bottom layer 5 and the ridge top layer 8, thereby being further able to satisfy various desired characteristics such as of optical confinement and device resistance, as with Embodiments 1 and 2.

Figure 14:
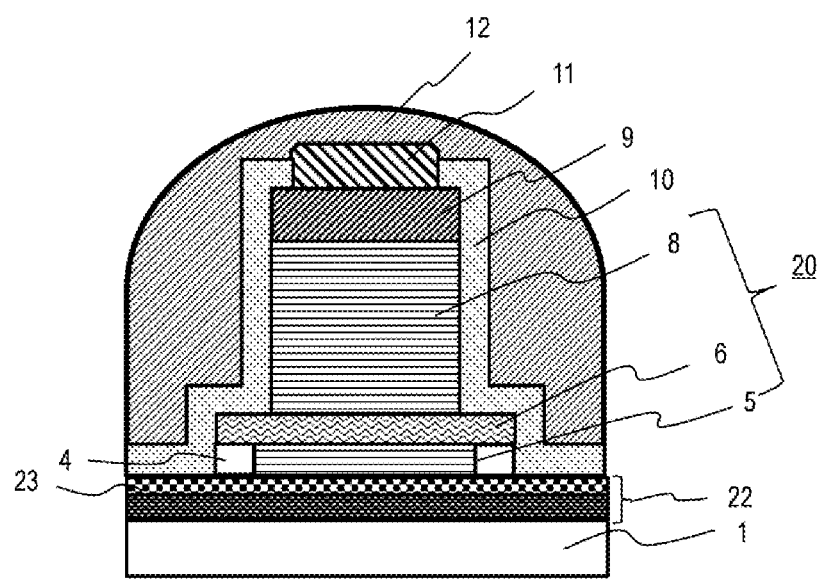
FIG. 14 is a cross sectional view showing another configuration of the semiconductor optical element according to Embodiment 3.

FIG. 14 is a cross-sectional view showing another configuration of the semiconductor element according to Embodiment 3. The configuration shown in FIG. 14 has hollow spaces 4 formed, without filled such as with the insulating film 10 and the gold plating 12, between the extending portions of the ridge intermediate layer 6 wider than the ridge bottom layer 5 and the active layer 22. The hollow spaces 4 can be formed by, for example, sputtering. With this configuration having the hollow spaces 4, concentration of stress on the ridge bottom layer 5 is also relieved, thereby being able to prevent the active layer 22 from deteriorating.

Figure 15:
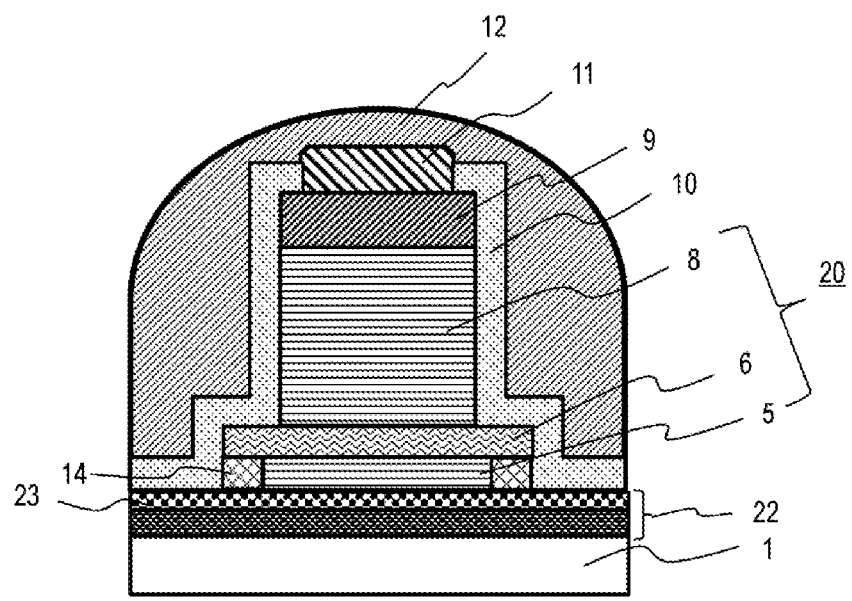
FIG. 15 is a cross sectional view showing still another configuration of the semiconductor optical element according to Embodiment 3.

FIG. 15 is a cross-sectional view showing still another configuration of the semiconductor optical element according to Embodiment 3. The configuration shown in FIG. 15 has the organic films 14 filled between the extending portions of the ridge intermediate layer 6 wider than the ridge bottom layer 5 and the active layer 22. With this configuration having the organic films 14, concentration of stress on the ridge bottom layer 5 is also relieved, thereby being able to prevent the active layer 22 from deteriorating.

The above describes that the electro-absorption semiconductor optical modulator having the active layer 22, the optical confinement layer formed as the light absorbing layer is configured to have the ridge intermediate layer 6. Not limited to this, the ridge-type semiconductor optical element may be a ridge-type semiconductor optical amplifier (SOA) that have the active layer 22 formed as a layer acting as optical amplification. Furthermore, the semiconductor optical element may be a ridge-type optical waveguide or the like in which the active layer 22 is formed of a semiconductor material having a refractive index higher than those of the ridge 20 and the semiconductor substrate 1 both acting as cladding layers and serves as an optical waveguide core layer for merely confining and propagating light. Thus, not limited to the electro-absorption semiconductor optical modulator, the ridge-type semiconductor optical element configured to have the ridge intermediate layer 6 formed, between the ridge bottom layer 5 and the ridge top layer 8 of the ridge 20, wider than the ridge bottom layer 5 and the ridge top layer 8, relieves stress imposing on the active layer 22, i.e., the optical confinement layer, thereby being further able to satisfy various desired characteristics such as of optical confinement and device resistance. In addition, it goes without saying that a ridge-type semiconductor optical element other than the electro-absorption semiconductor optical modulator may be configured to have the hollow spaces 4 as shown in FIG. 14 or the organic films 14 as shown in FIG. 15.

As described above, the semiconductor optical element according to Embodiment 3 includes the first cladding layer (semiconductor substrate 1); the second cladding layer (the ridge 20) formed in a ridge shape; and the active layer 22, the optical confinement layer interposed between the first cladding layer and the second cladding layer to propagate light, wherein the ridge 20 is configured with the ridge bottom layer 5; the ridge intermediate layer 6; and the ridge top layer 8 in this order from the active layer 22, and the ridge intermediate layer 6 is formed wider in cross section perpendicular to the optical axis—the light propagating direction in the active layer 22 than the ridge bottom layer 5 and the ridge top layer 8. With this configuration, the semiconductor optical element can be fabricated that relieves stress imposing on the optical confinement layer 22 and is further able to satisfy various desired characteristics such as of optical confinement and device resistance.

Embodiment 4

Figure 16:
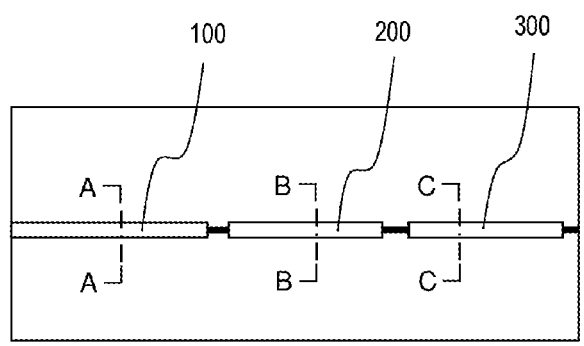
FIG. 16 is a plan view schematically showing a configuration of a semiconductor optical integrated element according to Embodiment 4.

FIG. 16 is a plan view showing a configuration of a semiconductor optical integrated element according to Embodiment 4. The semiconductor optical integrated element shown in FIG. 16 includes a DFB laser diode (DFB-LD) 100 for emitting a laser light; an electro-absorption semiconductor modulator (EAM) 200 for fast-modulating the emitted light; and a semiconductor optical amplifier (SOA) 300 for amplifying and outputting the modulated light, and thus constitutes a semiconductor laser transmitter. The cross sectional configuration of the DFB-LD 100 taken perpendicular to the optical axis, i.e., taken along the A-A line is any one of those shown in FIGS. 1 to 3 or FIGS. 7 to 9. The cross sectional configuration of the EAM 200 taken perpendicular to the optical axis, i.e., taken along the B-B line is any one of those shown in FIGS. 13 to 15. While the SOA 300, in particular, its active layer 20 is different in material from that of the EAM 200, the cross sectional configuration of the SOA 300 taken perpendicular to the optical axis, i.e., taken along the C-Cline is any one of those shown in FIGS. 13 to 15. Furthermore, the paths between the DFB-LD 100 and the EAM 200 and between the EAM 200 and the SOA 300 are formed of a simple optical waveguide, and its cross-sectional configuration is, for example, any one of those shown in FIGS. 13 to 15.

In particular, by forming each semiconductor optical element on the same semiconductor substrate, the first cladding layer of each semiconductor optical element can be constituted with the same semiconductor substrate. In this way, a semiconductor optical integrated element can be constituted that is integrated with a plurality of semiconductor optical elements different from each other using the same semiconductor substrate.

As described above, the semiconductor optical integrated element integrated with the semiconductor optical elements having the ridge structure includes the semiconductor optical elements each having the configuration of any one of those described in Embodiments 1 to 3, i.e., the first cladding layer (semiconductor substrate 1); the second cladding layer (the ridge 20) formed in the ridge shape; and the optical confinement layer (the active layer 2 or the active layer 20) interposed between the first cladding layer and the second cladding layer to propagate light, wherein the ridge 20 is configured with the ridge bottom layer 5; the ridge intermediate layer 6; and the ridge top layer 8 in this order from the optical confinement layer, and the ridge intermediate layer 6 is formed wider in cross section perpendicular to the optical axis—the light propagating direction in the optical confinement layer—than the ridge bottom layer 5 and the ridge top layer 8. With this configuration, concentration of stress on the ridge bottom layer 5 is relieved, thereby bringing about an effect of preventing deterioration of the characteristics of the optical confinement layer such as the active layer 2 or the active layer 20.

Although the present application is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations to one or more of the embodiments. It is therefore understood that numerous modifications which have not been exemplified can be devised without departing from the scope of the present application. For example, at least one of the constituent components may be modified, added, or eliminated. At least one of the constituent components mentioned in at least one of the preferred embodiments may be selected and combined with the constituent components mentioned in another preferred embodiment.

REFERENCE NUMERALS

1: semiconductor substrate;
2: active layer (optical confinement layer, first semiconductor layer);
4: hollow spaces;
5: ridge bottom layer;
6: ridge intermediate layer;
7: diffraction grating buried region;
8: ridge top layer;
10: insulating film;
12: gold plating;
14: organic film;
16: diffraction grating layer;
20: ridge;
22: active layer (optical confinement layer);
55: second semiconductor layer;
66: third semiconductor layer;
88: fourth semiconductor layer; and
166: fifth semiconductor layer.

The invention claimed is:

1. A semiconductor optical element comprising:
   a first cladding layer;
   a second cladding layer having a ridge formed in a ridge shape;
   an optical confinement layer interposed between the first cladding layer and the second cladding layer and adapted to propagate light, wherein
   the ridge is configured with a ridge bottom layer, a ridge intermediate layer, and a ridge top layer in this order from the optical confinement layer, a contact layer is provided on the ridge top layer, the ridge intermediate layer is formed wider in cross section perpendicular to an optical axis, which is a light propagating direction in the optical confinement layer, than the ridge bottom layer and the ridge top layer,
   a thickness of the ridge bottom layer is in a range of 10% to 15% of a thickness of the ridge, and
   a lowermost layer of the ridge formed in a ridge shape is the ridge bottom layer.

2. The semiconductor optical element of claim 1, wherein the ridge top layer and the ridge bottom layer is formed of the same material, and the ridge intermediate layer is formed of a material different from the material of the ridge top layer.

3. The semiconductor optical element of claim 1, wherein hollow spaces are formed between the optical confinement layer and extending portions of the ridge intermediate layer wider than the ridge bottom layer.

4. The semiconductor optical element of claim 1, wherein organic films are filled between the optical confinement layer and extending portions of the ridge intermediate layer wider than the ridge bottom layer.

5. The semiconductor optical element of claim 1, wherein at least part of the ridge covered with an insulating film, and the outside of the insulating film is covered with a metal.

6. The semiconductor optical element of claim 1, wherein the optical confinement layer is an active layer for emitting light by recombination of electrons and holes.

7. The semiconductor optical element of claim 6, wherein the ridge intermediate layer has a region in which a diffraction grating is buried.

8. The semiconductor optical element of claim 6, wherein a diffraction grating layer having a diffraction grating buried in the diffraction grating layer is formed between the optical confinement layer and the ridge bottom layer.

9. The semiconductor optical element of claim 1, wherein the optical confinement layer is an active layer for absorbing light when an electric field is applied to the optical confinement layer.

10. The semiconductor optical element of claim 1, wherein the optical confinement layer is an optical waveguide core layer for propagating light.

11. A semiconductor optical integrated element comprising:
    a plurality of semiconductor optical elements arranged on a common semiconductor substrate,
    wherein the plurality of semiconductor optical elements each are any one of the semiconductor optical elements set forth in claim 1, and each of the first cladding layers of the plurality of semiconductor optical elements is the semiconductor substrate.

12. A method of manufacturing a semiconductor optical element including a first cladding layer, a second cladding layer having a ridge formed in a ridge shape, an optical confinement layer interposed between the first cladding layer and the second cladding layer and adapted to propagate light, wherein the ridge is configured with a ridge bottom layer, a ridge intermediate layer, and a ridge top layer in this order from the optical confinement layer, ridge intermediate layer is formed wider in cross section perpendicular to an optical axis, which is a light propagating direction in the optical confinement layer, than the ridge bottom layer and the ridge top layer, and a thickness of the ridge bottom layer is in a range of 10% to 15% of a thickness of the ridge, the method comprising:

growing a material for the optical confinement layer to form a first semiconductor layer on one surface of a semiconductor substrate serving as the first cladding layer, growing a material for the ridge bottom layer to form a second semiconductor layer, and then growing a material for the ridge intermediate layer to form a third semiconductor layer, growing a material for the ridge top layer to form a fourth semiconductor layer in this order from the semiconductor substrate;

etching the fourth semiconductor layer to form the ridge top layer; and after etching the fourth semiconductor layer, etching the third semiconductor layer to have a width of the ridge intermediate layer, and after etching the third semiconductor layer, etching the second semiconductor layer to have a width of the ridge bottom layer.

13. The method of manufacturing the semiconductor optical element, of claim 12, further comprising the step of:

forming a portion for burying a diffraction grating by removing part of the third semiconductor layer after forming the third semiconductor layer, and then growing and burying the diffraction grating in the portion for burying the diffraction grating.

14. The method of manufacturing the semiconductor optical element, of claim 12, wherein a material for a diffraction grating layer is grown to form a fifth semiconductor layer on a surface of the first semiconductor layer before the second semiconductor layer is formed, and then a portion for burying a diffraction grating is formed by removing part of the fifth semiconductor layer to grow and bury a diffraction grating in the portion for burying the diffraction grating, and then the second semiconductor layer is formed on a surface of the fifth semiconductor layer.

* * * * *